United States Patent
Carroll

(10) Patent No.: US 7,567,125 B2
(45) Date of Patent: Jul. 28, 2009

(54) DIFFERENTIAL AMPLIFIER WITH MULTIPLE SIGNAL GAINS AND WIDE DYNAMIC RANGE

(75) Inventor: Kenneth J. Carroll, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 107 days.

(21) Appl. No.: 11/748,950

(22) Filed: May 15, 2007

(65) Prior Publication Data

US 2008/0284514 A1 Nov. 20, 2008

(51) Int. Cl.
*H03F 3/45* (2006.01)
(52) U.S. Cl. .................................. 330/254; 330/253
(58) Field of Classification Search ......... 330/252–254, 330/359, 563
See application file for complete search history.

(56) References Cited

U.S. PATENT DOCUMENTS

| | | | |
|---|---|---|---|
| 5,089,789 A | 2/1992 | Van Tran | |
| 5,461,342 A * | 10/1995 | Crabtree | 330/252 |
| 6,822,513 B1 | 11/2004 | Li et al. | |
| 6,914,485 B1 | 7/2005 | Carroll | |
| 7,196,581 B2 | 3/2007 | Gammie et al. | |

OTHER PUBLICATIONS

International Search Report and Written Opinion for International Application No. PCT/US08/063566, Oct. 16, 2008.
Gilbert, Barrie; "The Multi-tahn Principle: A Tutorial Review;" IEEE Journal of Solid-State Circuits, vol. 33, No. 1, dated Jan. 1998, 16 pages.
German Search Report issued in connection with co-pending German Patent Application No. 10 2008 023 518.0; German Patent Office, dated Mar. 12, 2009, 4 pages.

* cited by examiner

*Primary Examiner*—Khanh V Nguyen
(74) *Attorney, Agent, or Firm*—Vedder Price P.C.

(57) ABSTRACT

A circuit and method for amplifying a differential input signal over a wide dynamic range using multiple signal gains such that, over a predetermined range of values of the differential input signal, a ratio of the differential output signal to the differential input signal varies in relation to a continuous combination of the multiple signal gains.

11 Claims, 3 Drawing Sheets

DIFFERENTIAL AMPLIFIER WITH MULTIPLE SIGNAL GAINS AND WIDE DYNAMIC RANGE

BACKGROUND

1. Field of the Invention

The present invention relates to differential amplifiers, including instrumentation amplifiers, and in particular, differential amplifiers requiring high signal gain and wide input signal range.

2. Description of the Related Art

In many applications for differential amplifiers, particularly instrumentation amplifiers, it is often a design requirement to provide multiple gain settings, in one or more of which it is often necessary to provide maximum loop gain to guarantee adequate gain accuracy. One or more of the remaining gain settings may not require the loop gain to be as high, but it may be necessary to accommodate a much wider input signal range than might be available at the higher gain settings. These requirements are generally conflicting and are often resolved only by increasing the complexity of the circuitry.

For example, in an amplifier having two gain settings, e.g., 10 and 1,000, the maximum input signal range requirement for the higher gain setting may only be +/−5 millivolts. For the higher gain of 1,000, such a signal range will produce an output signal of +/−5 volts, which may be close to or at the maximum supply voltage VDD of the circuit. However, to maintain a gain accuracy of 0.1% at this higher gain setting, the overall loop gain of the system must be significantly higher, e.g., 1,000,000.

For the lower gain of 10, maintaining a gain accuracy of 0.1% would only require a loop gain of 10,000. However, with the input signal range of +/−5 millivolts, the output signal range will only be ±50 millivolts, which is a small portion of the available output signal range. In that case, a wider input signal range, e.g., +/−500 millivolts, may be more desirable. However, such a higher input signal range would be problematic for the higher gain.

SUMMARY OF THE INVENTION

In accordance with the presently claimed invention, a circuit and method are provided for amplifying a differential input signal over a wide dynamic range using multiple signal gains such that, over a predetermined range of values of the differential input signal, a ratio of the differential output signal to the differential input signal varies in relation to a continuous combination of the multiple signal gains.

In accordance with one embodiment of the presently claimed invention, a differential amplifier with multiple signal gains for amplifying a differential input signal over a wide dynamic range includes:

differential input electrodes to convey a differential input signal;

differential output electrodes to convey a differential output signal;

first differential amplifier circuitry having a first signal gain and coupled between the differential input and output electrodes to receive at least a first portion of the differential input signal and provide a first portion of the differential output signal; and second differential amplifier circuitry having a second signal gain lower than the first signal gain and coupled between the differential input and output electrodes to receive at least a second portion of the differential input signal and provide a second portion of the differential output signal;

wherein, over a predetermined range of values of the differential input signal, a ratio of the differential output signal to the differential input signal varies in relation to a continuous combination of the first and second signal gains.

In accordance with another embodiment of the presently claimed invention, a differential amplifier with multiple signal gains for amplifying a differential input signal over a wide dynamic range includes:

first differential amplifier means having a first signal gain for receiving at least a first portion of a differential input signal and providing a first portion of a differential output signal; and second differential amplifier means having a second signal gain lower than the first signal gain for receiving at least a second portion of the differential input signal and providing a second portion of the differential output signal;

wherein, over a predetermined range of values of the differential input signal, a ratio of the differential output signal to the differential input signal varies in relation to a continuous combination of the first and second signal gains.

In accordance with still another embodiment of the presently claimed invention, a method for amplifying a differential input signal over a wide dynamic range using multiple signal gains includes:

receiving a differential input signal;

amplifying at least a first portion of the differential input signal with a first signal gain to provide a first portion of a differential output signal;

amplifying at least a second portion of the differential input signal with a second signal gain lower than the first signal gain to provide a second portion of the differential output signal; and combining the first and second portions of the differential output signal to provide the differential output signal such that, over a predetermined range of values of the differential input signal, a ratio of the differential output signal to the differential input signal varies in relation to a continuous combination of the first and second signal gains.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

As discussed in more detail below, a differential amplifier in accordance with the presently claimed invention uses multiple signal gains to provide a high signal gain for small input differential signals, with a gradual transition to a lower signal gain for larger differential input signals. In accordance with a further embodiment, the signal gains are transconductance gains, with an input differential signal stage having low voltage tolerant metal oxide semiconductor (MOS) input transistors as are typically found in a complementary MOS (CMOS) or bipolar CMOS (BiCMOS) process in a high voltage design such that the input MOS devices are isolated from otherwise destructive higher voltages. Accordingly, such an amplifier in accordance with the presently claimed invention accommodates conflicting requirements of high gain and low signal range for high gain settings, and low gain and high signal range for low gain settings. Additionally, the input MOS field effect transistors (MOSFETs) are implemented in a bootstrapped configuration (further information about which can be found in U.S. Pat. No. 6,914,485, the disclosure of which is incorporated herein by reference).

Figure 1:
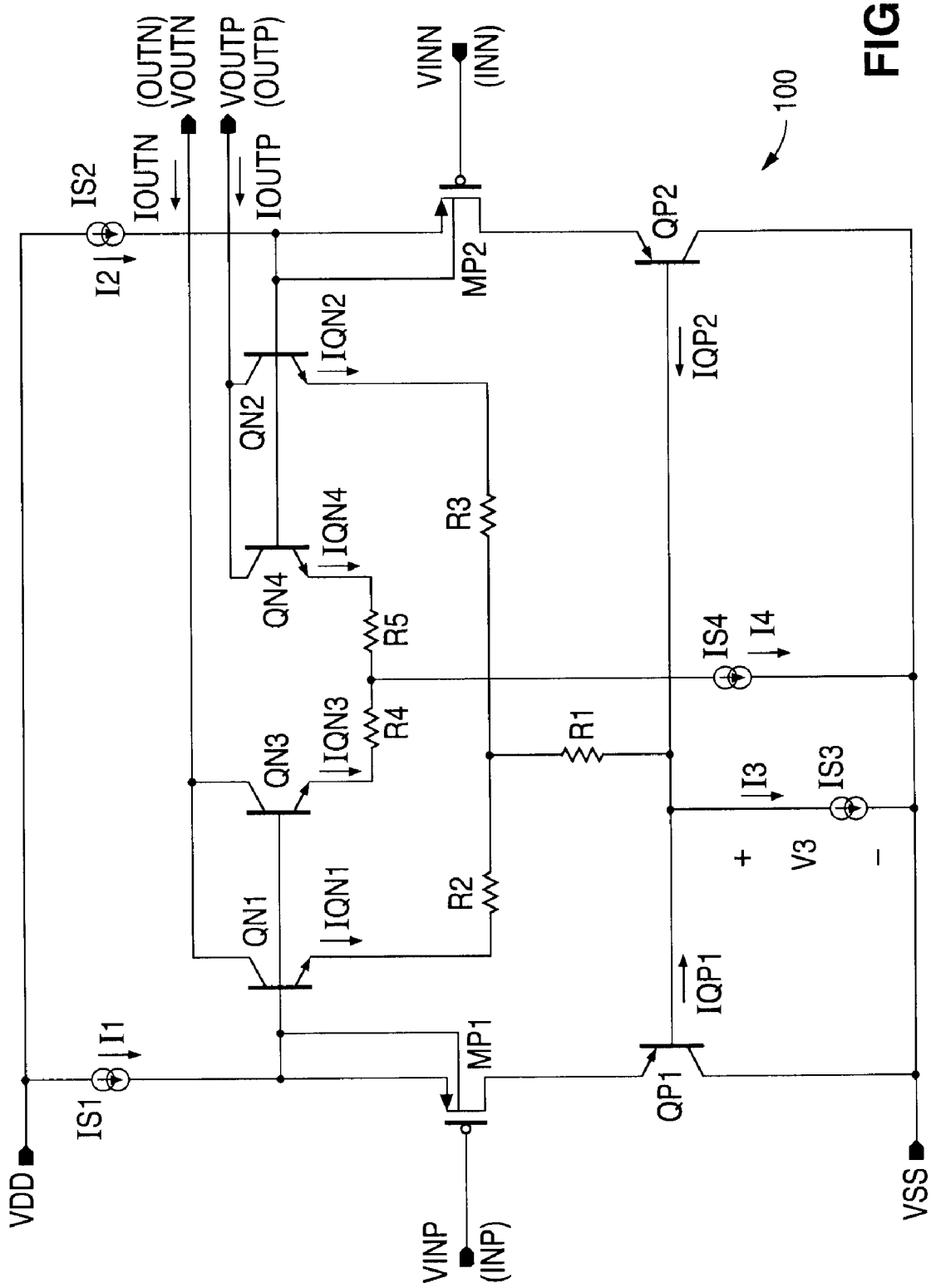
FIG. 1 is a schematic diagram of a differential amplifier in accordance with one embodiment of the presently claimed invention.

Referring to FIG. 1, a differential amplifier 100 in accordance with one embodiment of the presently claimed invention can be implemented substantially as shown. Transistors MP1 and MP2 (p-type MOSFETs) receive the positive VINP and negative VINN phases, respectively of the differential input signal at their respective gate electrodes. These transistors MP1, MP2 receive biasing currents I1, I2 from current sources IS1, IS2 and are bootstrapped by transistors QP1 and QP2 (PNP bipolar junction transistors) between the power supply terminals VDD, VSS, as shown. These transistors MP1, MP2 provide a high impedance input for receiving the differential input voltage to provide a buffered differential input voltage via source follower action at the base electrodes of transistors QN1, QN2, QN3 and QN4 (NPN bipolar).

Transistors QN1 and QN2 along with resistors R2 and R3, and current source IS3 form a low gain differential amplifier circuit. Current source IS3 provides tail current I3 for biasing transistors QN1 and QN2, which, in turn, produce the positive IQN2 and negative IQN1 portions of the positive IOUTP and negative IOUTN phases, respectively, of the differential output current. The resulting voltage V3 across current source IS3 and base currents IQP1, IQP2 of the bootstrapped transistors QP1, QP2 provide biasing for the bootstrapped transistors QP1, QP2.

Transistors QN3 and QN4 (NPN bipolars), along with resistors R4 and R5, and current source IS4 form a high gain differential amplifier circuit. Current source IS4 provides tail current I4 for the differential transistor pair QN3, QN4, which, in turn, provide additional positive IQN4 and negative IQN3 portions of the positive IOUTP and negative IOUTN phases, respectively, of the differential output current.

Figure 2B:
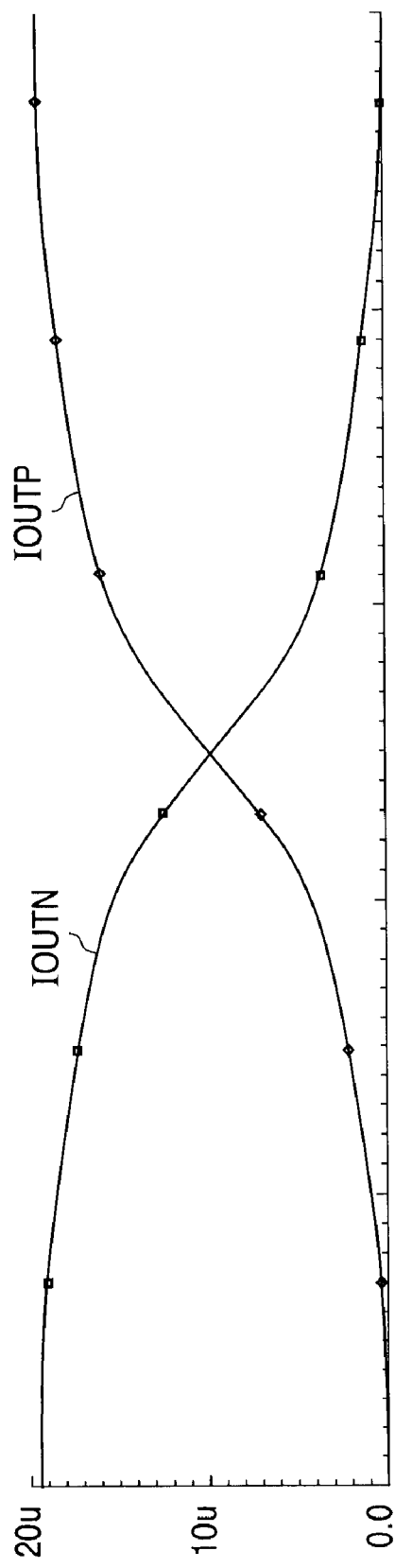
FIGS. 2A and 2B illustrate transconductance curves for the circuit of FIG. 1.
Figure 2A:
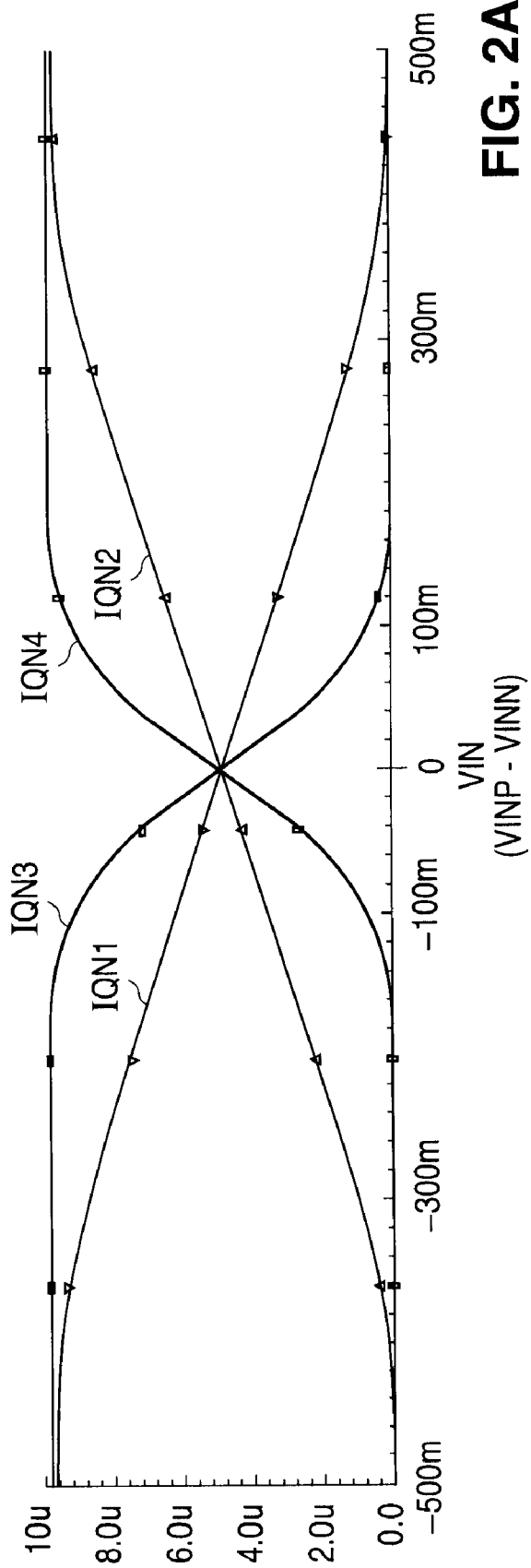

Referring to FIG. 2A, the differing contributions of the low gain (e.g., low transconductance) differential amplifier pair QN1, QN2, and high gain (e.g., high transconductance) differential amplifier pair QN3, QN4 are shown. As indicated, the output current components IQN1, IQN2 for the low gain differential amplifier pair QN1, QN2 display substantially linear characteristics over a wide range of input signal VIN amplitudes as they traverse between their minimum and maximum possible values based on the available power supply voltage VDD-VSS. Conversely, the output current components IQN3, IQN4 for the high gain differential amplifier pair QN3, QN4 display substantially linear characteristics over a more narrow range of input signal VIN values as they traverse between their minimum and maximum available values.

Referring to FIG. 2B, the output current components IQN1, IQN2, IQN3 and IQN4 combine together at the output electrodes OUTP, OUTN to form the resultant positive IOUTP and negative IOUTN phases of the output signal current. In other words, positive output signal components IQN2 and IQN4 sum together to form the positive output signal component IOUTP, and negative output signal components IQN1 and IQN3 sum together to form the negative phase IOUTN of the output signal current. While these output current signal phases IOUTP, IOUTN do not display linear characteristics over as wide a range as those of their constituent component currents IQN1, IQN2, IQN3, IQN4, they are nonetheless monotonic over a broad range of input signal values as they traverse between their minimum and maximum signal values. However, as discussed in more detail below, such nonlinear characteristics can be compensated at a system level.

Hence, as should be recognized from the transconductance curves of FIGS. 2A and 2B, a differential amplifier in accordance with the presently claimed invention provides two gain regions. A higher gain region provided by transistors QN3 and QN4 over a relatively narrow portion of the input signal VINP-VINN range transitions smoothly to a lower gain region provided by transistors QN1 and QN2 over a wider portion of the input signal VINP-VINN range.

Figure 3:
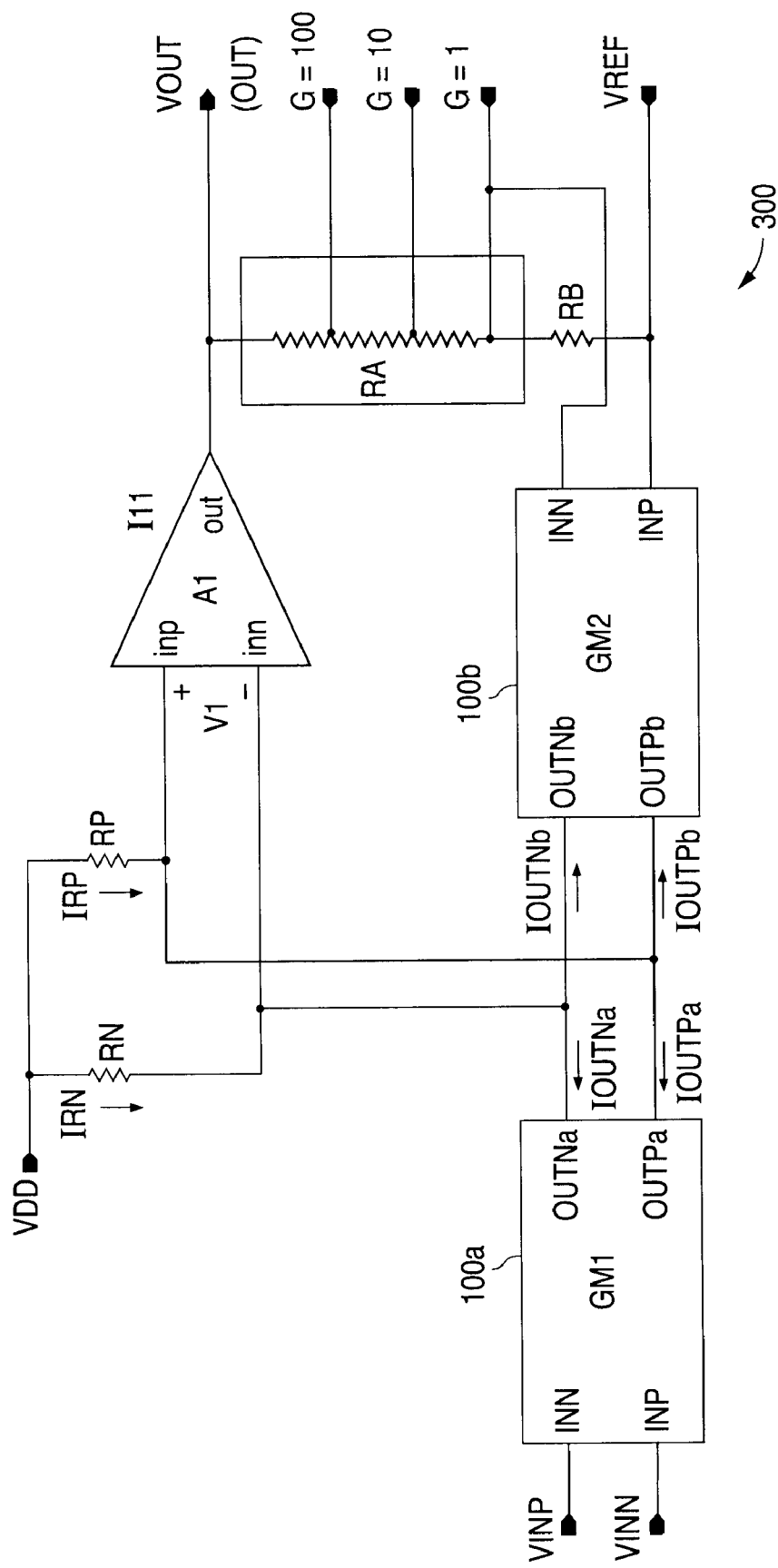
FIG. 3 is a functional block diagram of a closed-looped system using differential amplifiers in accordance with another embodiment of the presently claimed invention.

Referring to FIG. 3, the circuitry 100 of FIG. 1 can be incorporated in a closed loop system 300 to provide a linear output voltage VOUT as follows. The circuitry 100 of FIG. 1 is replicated, with one such circuit 100a amplifying the differential input signal VIN as discussed above, while another such circuit 100b serves as a feedback amplifier to feed back a voltage divided portion of the output signal VOUT. Their respective positive IOUTPa, IOUTPb and negative IOUTNa, IOUTNb phases of the differential output signal current sum together to provide the currents IRP, IRN through the pullup resistors RP, RN. This produces a differential voltage VI at the input of an operational amplifier A1, the output voltage VOUT of which is divided down and summed it with a reference voltage VREF. This voltage dividing action is performed in a resistor array RA, RB in which the series resistor RA is selectively changed in value by shorting it at various points to the output electrode OUT supplying the output voltage VOUT. The gain of this voltage divider network is (RA+RB)/RB, with the resistance value RA being changed to achieve the desired loop gain. For example, for a loop gain of unity, resistor RA is shorted entirely by connecting electrode G=1 to the output electrode OUT, while the other gain electrodes G=10, G=100, are left open. Similarly, for a loop gain of 10, electrode G=10 is shorted to the output electrode OUT while the remaining gain control electrodes G=1, G=100 are left open. As a result, mutual cancellation of the inherent nonlinear performance characteristics of the amplifiers 100*a*, 100*b* occurs.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a differential amplifier with multiple signal gains for amplifying a differential input signal over a wide dynamic range, comprising:
    differential input electrodes to convey a differential input signal;
    differential output electrodes to convey a differential output signal;
    first differential amplifier circuitry having a first signal gain and coupled between said differential input and output electrodes to receive at least a first portion of said differential input signal and provide a first portion of said differential output signal, and including
        a first differential amplifier sub-circuit to receive said at least said first portion of said differential input signal and a first tail current, and provide said first portion of said differential output signal in relation to said first signal gain, and
        a first bias sub-circuit coupled to said first differential amplifier sub-circuit to provide said first tail current; and
    second differential amplifier circuitry having a second signal gain lower than said first signal gain and coupled between said differential input and output electrodes to receive at least a second portion of said differential input signal and provide a second portion of said differential output signal, and including
        a second differential amplifier sub-circuit to receive said at least said second portion of said differential input signal and a second tail current, provide said second portion of said differential output signal in relation to said second signal gain, and
        a second bias sub-circuit coupled to said second differential amplifier sub-circuit to provide said second tail current;
    wherein, over a predetermined range of values of said differential input signal, a ratio of said differential output signal to said differential input signal varies in relation to a continuous combination of said first and second signal gains.

2. The apparatus of claim 1, wherein said second bias sub-circuit further provides a first bias signal and further comprising differential input amplifier circuitry coupled to said second differential amplifier circuitry and said differential input electrodes to receive said first bias signal and an incoming differential signal and provide said differential input signal.

3. The apparatus of claim 2, wherein:
    said incoming differential signal comprises a differential voltage;
    said differential input signal comprises a differential input current; and
    said differential output signal comprises a differential output current.

4. The apparatus of claim 2, wherein said differential input amplifier circuitry comprises:
    biasing circuitry coupled to said second bias sub-circuit to receive said first bias signal and provide second and third bias signals; and
    voltage follower circuitry coupled to said biasing circuitry, said second differential amplifier sub-circuit and said differential input electrodes to receive said second and third bias signals and said incoming differential signal and provide said differential input signal.

5. An apparatus including a differential amplifier with multiple signal gains for amplifying a differential input signal over a wide dynamic range, comprising:
    differential input electrodes to convey a differential input signal;
    differential output electrodes to convey a differential output signal;
    first differential amplifier circuitry having a first signal gain and coupled between said differential input and output electrodes to receive at least a first portion of said differential input signal and provide a first portion of said differential output signal; and
    second differential amplifier circuitry having a second signal gain lower than said first signal gain and coupled between said differential input and output electrodes to receive at least a second portion of said differential input signal and provide a second portion of said differential output signal; and
    differential input amplifier circuitry coupled to said differential input electrodes to receive an incoming differential signal and provide said differential input signal;
    wherein, over a predetermined range of values of said differential input signal, a ratio of said differential output signal to said differential input signal varies in relation to a continuous combination of said first and second signal gains.

6. The apparatus of claim 5, wherein:
    said second differential amplifier circuitry includes bias circuitry to provide a bias signal; and
    said differential input amplifier circuitry is further coupled to said bias circuitry to receive said bias signal.

7. The apparatus of claim 5, wherein:
    said incoming differential signal comprises a differential voltage;
    said differential input signal comprises a differential input current; and
    said differential output signal comprises a differential output current.

8. An apparatus including a differential amplifier with multiple signal gains for amplifying a differential input signal over a wide dynamic range, comprising:
    first differential amplifier means having a first signal gain for receiving at least a first portion of a differential input signal and providing a first portion of a differential output signal;
    second differential amplifier means having a second signal gain lower than said first signal gain for receiving at least a second portion of said differential input signal and providing a second portion of said differential output signal, and further for providing a bias signal; and
    differential input amplifier means for receiving said bias signal and an incoming differential signal and providing said differential input signal;
    wherein, over a predetermined range of values of said differential input signal, a ratio of said differential output signal to said differential input signal varies in relation to a continuous combination of said first and second signal gains.

9. An apparatus including a differential amplifier with multiple signal gains for amplifying a differential input signal over a wide dynamic range, comprising:

first differential amplifier means having a first signal gain for receiving at least a first portion of a differential input signal and providing a first portion of a differential output signal;

second differential amplifier means having a second signal gain lower than said first signal gain for receiving at least a second portion of said differential input signal and providing a second portion of said differential output signal; and differential input amplifier means for receiving an incoming differential signal and providing said differential input signal;

wherein, over a predetermined range of values of said differential input signal, a ratio of said differential output signal to said differential input signal varies in relation to a continuous combination of said first and second signal gains.

10. A method for amplifying a differential input signal over a wide dynamic range using multiple signal gains, comprising:

receiving an incoming differential signal;

amplifying said incoming differential signal to provide a differential input signal;

amplifying at least a first portion of said differential input signal with a first signal gain to provide a first portion of a differential output signal;

amplifying at least a second portion of said differential input signal with a second signal gain lower than said first signal gain to provide a section portion of said differential output signal; and combining said first and second portions of said differential output signal to provide said differential output signal such that, over a predetermined range of values of said differential input signal, a ratio of said differential output signal to said differential input signal varies in relation to a continuous combination of said first and second signal gains.

11. The method of claim 10, wherein:

said receiving an incoming differential signal comprises receiving a differential voltage;

said amplifying said incoming differential signal to provide said differential input signal comprises providing a differential input current;

said amplifying at least a first portion of said differential input signal with a first signal gain to provide a first portion of a differential output signal comprises providing a first portion of a differential output current; and said amplifying at least a second portion of said differential input signal with a second signal gain lower than said first signal gain to provide a second portion of said differential output signal comprises providing a second portion of said differential output current.

\* \* \* \* \*